United States Patent
Tanaka et al.

(10) Patent No.: US 9,123,693 B2
(45) Date of Patent: Sep. 1, 2015

(54) MOLD MODULE UTILIZED AS POWER UNIT OF ELECTRIC POWER STEERING APPARATUS AND ELECTRIC POWER STEERING APPARATUS

(75) Inventors: Daisuke Tanaka, Chiyoda-ku (JP); Yoshihito Asao, Chiyoda-ku (JP); Katsuhiko Omae, Chiyoda-ku (JP); Tetsushi Watanabe, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/983,727

(22) PCT Filed: Apr. 7, 2011

(86) PCT No.: PCT/JP2011/058808
§ 371 (c)(1),
(2), (4) Date: Aug. 5, 2013

(87) PCT Pub. No.: WO2012/137333
PCT Pub. Date: Oct. 11, 2012

(65) Prior Publication Data
US 2014/0151146 A1    Jun. 5, 2014

(51) Int. Cl.
*H01L 23/42* (2006.01)
*B62D 5/04* (2006.01)
(Continued)

(52) U.S. Cl.
CPC *H01L 23/42* (2013.01); *B62D 5/04* (2013.01); *B62D 5/0406* (2013.01); *H01L 23/36* (2013.01);
(Continued)

(58) Field of Classification Search
CPC .. B62D 5/0406; H01L 23/36; H01L 23/3737; H01L 23/42; H01L 24/34; H02K 11/0073; H02K 9/22

USPC ........... 180/443, 444; 438/124, 118, 122, 127
See application file for complete search history.

(56) References Cited

U.S. PATENT DOCUMENTS 6,208,020 B1    3/2001  Minamio et al.
6,562,660 B1    5/2003  Sakamoto et al.
(Continued)

FOREIGN PATENT DOCUMENTS

CN    1315823 A    10/2001
EP    1032037 A2    8/2000
(Continued)

OTHER PUBLICATIONS

Japanese Office Action, issued Feb. 18, 2014, Patent Application No. 2013-508686.
(Continued)

*Primary Examiner* — Kevin Hurley
(74) *Attorney, Agent, or Firm* — Sughrue Mion, PLLC; Richard C. Turner

(57) ABSTRACT

There is provided a mold module and an electric power steering apparatus in which the temperature distribution in electronic components such as semiconductor chips utilized in an electronic relay and an inverter circuit unit is equalized and hence the heat radiation performance can be improved. In a mold module according to the present invention, a plurality of terminals for forming wiring leads and a plurality of electronic components mounted on the respective terminals are molded with a molding resin; at least part of the plurality of terminals are exposed at the rear side of the molding resin; an electric power steering apparatus according to the present invention utilizes the mold module.

17 Claims, 10 Drawing Sheets

(51) Int. Cl.
*H02K 11/00* (2006.01)
*H01L 23/00* (2006.01)
*H02K 9/22* (2006.01)
*H01L 23/36* (2006.01)
*H01L 23/373* (2006.01)
*H01L 23/31* (2006.01)
*H02K 3/52* (2006.01)
*H02K 5/08* (2006.01)
*H02K 5/22* (2006.01)
*H02K 7/116* (2006.01)

(52) U.S. Cl.
CPC ............ *H01L 23/3737* (2013.01); *H01L 24/34* (2013.01); *H02K 9/22* (2013.01); *H02K 11/0073* (2013.01); *H01L 23/3107* (2013.01); *H01L 2224/40137* (2013.01); *H01L 2224/40247* (2013.01); *H01L 2924/07802* (2013.01); *H01L 2924/1301* (2013.01); *H01L 2924/13091* (2013.01); *H02K 3/522* (2013.01); *H02K 5/08* (2013.01); *H02K 5/225* (2013.01); *H02K 7/1166* (2013.01); *H05K 2201/10924* (2013.01); *H05K 2201/10931* (2013.01)

(56) References Cited

U.S. PATENT DOCUMENTS

| 8,446,111 B2* | 5/2013 | Sonoda et al. .................... 318/9 |
| 2001/0007780 A1 | 7/2001 | Minamio et al. |
| 2002/0027276 A1 | 3/2002 | Sakamoto et al. |
| 2004/0183385 A1 | 9/2004 | Takahashi et al. |
| 2007/0200207 A1 | 8/2007 | Ramos et al. |
| 2010/0181666 A1 | 7/2010 | Andou |
| 2011/0066332 A1 | 3/2011 | Sonoda et al. |
| 2011/0133561 A1 | 6/2011 | Kanazawa et al. |
| 2011/0304032 A1 | 12/2011 | Ramos et al. |

FOREIGN PATENT DOCUMENTS

| EP | 1460749 A1 | 9/2004 |
| JP | 2001-250883 A | 9/2001 |
| JP | 2001-257291 A | 9/2001 |
| JP | 2001-274313 A | 10/2001 |
| JP | 2002-076195 A | 3/2002 |
| JP | 2004-140229 A | 5/2004 |
| JP | 2005-327791 A | 11/2005 |
| JP | 2006049698 A | 2/2006 |
| JP | 2007-129175 A | 5/2007 |
| JP | 2007-234921 A | 9/2007 |
| JP | 2007-249290 A | 9/2007 |
| JP | 2008-174097 A | 7/2008 |
| JP | 2009528699 A | 8/2009 |
| JP | 2009-206406 A | 9/2009 |
| JP | 2010-165923 A | 7/2010 |
| WO | 2010/007672 A1 | 1/2010 |
| WO | 2010/010769 A1 | 1/2010 |

OTHER PUBLICATIONS

Japanese Office Action issued Oct. 14, 2014, Patent Application No. 2013-508686.
Communication dated Apr. 1, 2015 from the State Intellectual Property Office of the P.R.C. in counterpart application No. 201180068636.4.
Communication dated Jun. 10, 2015 from the European Patent Office in counterpart application No. 11863213.2.

* cited by examiner

MOLD MODULE UTILIZED AS POWER UNIT OF ELECTRIC POWER STEERING APPARATUS AND ELECTRIC POWER STEERING APPARATUS

CROSS REFERENCE TO RELATED APPLICATIONS

This application is a National Stage of International Application No. PCT/JP2011/058808 filed Apr. 7, 2011, the contents of all of which are incorporated herein by reference in their entirety.

TECHNICAL FIELD

The present invention relates to a mold module, utilized as a power unit of an electric power steering apparatus, in which a plurality of lead frames and a plurality of electronic components mounted on the respective lead frames are molded with an insulating resin and to an electric power steering apparatus utilizing the mold module.

BACKGROUND ART

A conventional electric power steering apparatus is configured in such a way that power-unit electronic components forming an inverter and an electronic relay are mounted on a substrate such as a metal or a ceramic and that heat in the electronic components are radiated from the bottom side of the substrate to a heat sink by way of radiation grease or the like (e.g., refer to Patent Document 1).

PRIOR ART REFERENCE

Patent Document

[Patent Document 1] International Publication No. WO2010/007672A1

DISCLOSURE OF THE INVENTION

Problems to be Solved by the Invention

As described above, a conventional electric power steering apparatus is configured in such a way that power-unit electronic components forming an inverter and an electronic relay are mounted on a substrate such as a metal or a ceramic and that heat in the electronic components are radiated from the bottom side of the substrate to a heat sink by way of radiation grease or the like; therefore, there have been problems that the temperature distribution in the electronic components is not uniform and that because the thermal resistance in the heat radiation path increases, the heat radiation performance is deteriorated.

The present invention has been implemented in order to solve the foregoing problems in a conventional apparatus; the objective thereof is to provide a mold module utilized as a power unit of an electric power steering apparatus, in which the temperature distribution in electronic components such as semiconductor chips utilized in an electronic relay and an inverter circuit unit is equalized and hence the heat radiation performance can be improved, and an electric power steering apparatus utilizing the mold module.

Means for Solving the Problems

In a mold module utilized as a power unit of an electric power steering apparatus, according to the present invention, a plurality of lead frames for forming wiring leads and a plurality of electronic components mounted on the respective lead frames are molded with a molding resin; the mold module is characterized in that at least part of the plurality of lead frames are exposed at the rear side of the molding resin.

An electric power steering apparatus according to the present invention is provided with a speed reducing mechanism coupled with a steering shaft of a vehicle, a motor whose rotor shaft is coupled with the speed reducing mechanism, and a motor controller that controls electric power supplied to an armature winding of the motor so as to make the motor produce predetermined torque. The electric power steering apparatus is characterized in that the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, and in that the rear side of the mold module is adhered to the case of the motor through the intermediary of a heat transfer resin.

An electric power steering apparatus according to the present invention is provided with a speed reducing mechanism coupled with a steering shaft of a vehicle, a motor whose rotor shaft is coupled with the speed reducing mechanism, and a motor controller that controls electric power supplied to an armature winding of the motor so as to make the motor produce predetermined torque. The electric power steering apparatus is characterized in that the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, and in that the rear side of the mold module is adhered to the motor case through the intermediary of a ceramic insulation sheet.

An electric power steering apparatus according to the present invention is provided with a speed reducing mechanism coupled with a steering shaft of a vehicle, a motor whose rotor shaft is coupled with the speed reducing mechanism, and a motor controller that controls electric power supplied to an armature winding of the motor so as to make the motor produce predetermined torque. The electric power steering apparatus is characterized in that the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, a heat sink, and a controller case that incorporates the mold module and the heat sink, and in that the rear side of the mold module is adhered to the heat sink through the intermediary of a heat transfer resin.

An electric power steering apparatus according to the present invention is provided with a speed reducing mechanism coupled with a steering shaft of a vehicle, a motor whose rotor shaft is coupled with the speed reducing mechanism, and a motor controller that controls electric power supplied to an armature winding of the motor so as to make the motor produce predetermined torque. The electric power steering apparatus is characterized in that the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, a heat sink, and a controller case that incorporates the mold module and the heat sink, and in that the rear side of the mold module is adhered to the heat sink through the intermediary of a ceramic insulation sheet.

Advantage of the Invention

In a mold module utilized as a power unit of an electric power steering apparatus according to the present invention, at least part of a plurality of lead frames are exposed at the rear side of the molding resin; therefore, when the mold module is mounted in the electric power steering apparatus, the rear side of the mold module is adhered to the motor case, the heat sink, or the like through the intermediary of a heat transfer resin, so that it is made possible to obtain a mold module that reduces the thermal resistances of electronic components such as semiconductor chip and the like in a steady-state manner as well as in a transient manner and that raises the heat radiation effect.

In an electric power steering apparatus according to the present invention, the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, and the rear side of the mold module is adhered to the case of the motor through the intermediary of a heat transfer resin; therefore, it is made possible to reduce the thermal resistances of electronic components such as semiconductor chip and the like in a steady-state manner as well as in a transient manner and to raise the heat radiation effect.

In an electric power steering apparatus according to the present invention, the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, and the rear side of the mold module is adhered to the motor case through the intermediary of a ceramic insulation sheet; therefore, the electric power steering makes it possible that, while the high thermal conductivity is kept, the gap is stabilized through the thickness of the ceramic insulation sheet and that even in the case where electrically-conductive foreign materials intrude, the bottom side of the mold module or the motor case is distorted, or burrs occur, the insulation between the mold module and the motor case can be secured; thus, the reliability of insulation can be enhanced.

In an electric power steering apparatus according to the present invention, the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, a heat sink, and a controller case that incorporates the mold module and the heat sink, and the rear side of the mold module is adhered to the heat sink through the intermediary of a heat transfer resin; therefore, it is made possible to reduce the thermal resistances of electronic components such as semiconductor chip and the like in a steady-state manner as well as in a transient manner and to raise the heat radiation effect.

In an electric power steering apparatus according to the present invention, the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, a heat sink, and a controller case that incorporates the mold module and the heat sink, and the rear side of the mold module is adhered to the heat sink through the intermediary of a ceramic insulation sheet; therefore, the electric power steering makes it possible that, while the high thermal conductivity is kept, the gap is stabilized through the thickness of the ceramic insulation sheet and that even in the case where electrically-conductive foreign materials intrude, the bottom side of the mold module or the heat sink is distorted, or burrs occur, the insulation between the mold module and the heat sink can be secured; thus, the reliability of insulation can be enhanced.

BEST MODE FOR CARRYING OUT THE INVENTION

Embodiment 1

Figure 1:
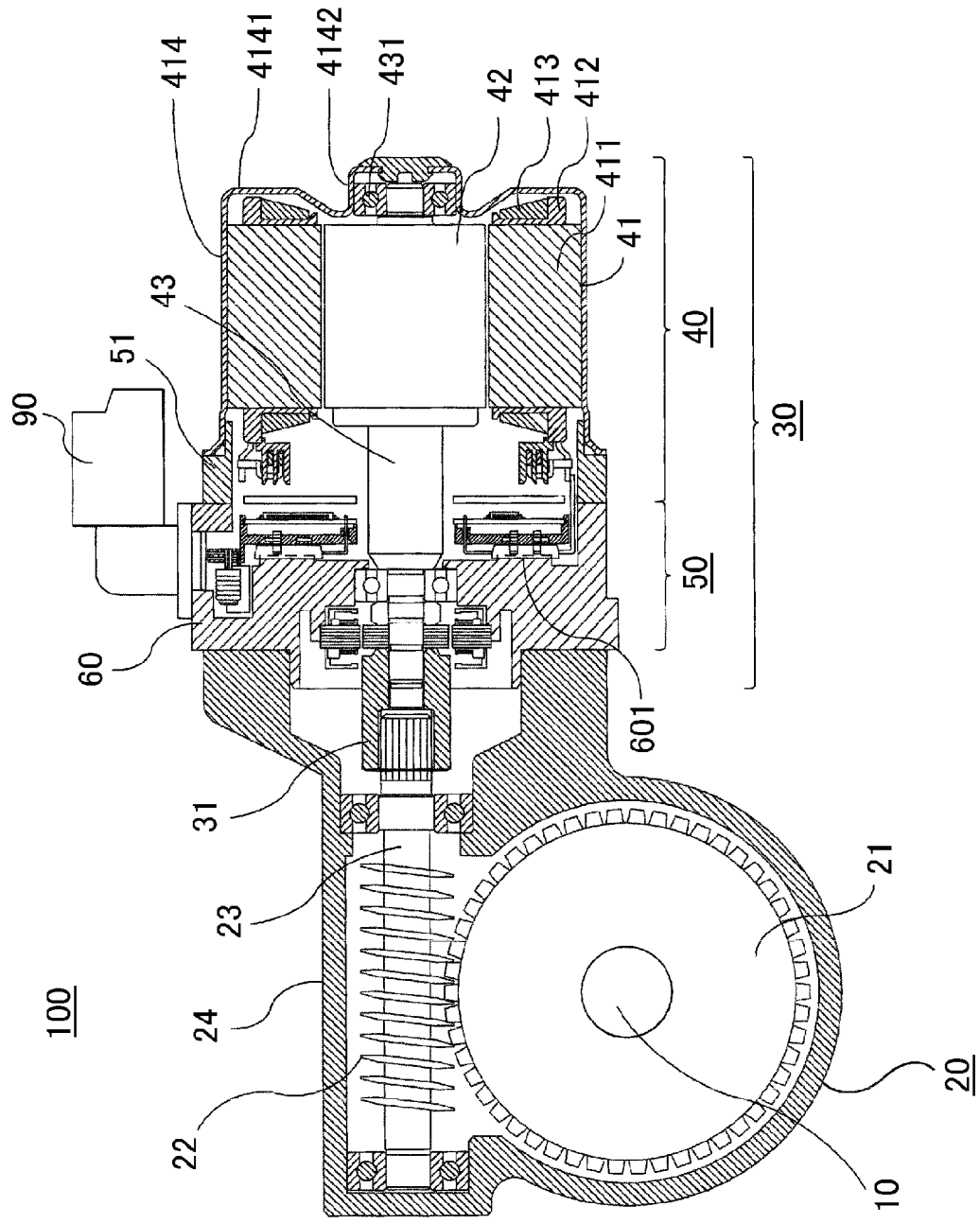
FIG. 1 is a cross-sectional view of an electric power steering apparatus according to Embodiment 1 of the present invention.
Figure 2:
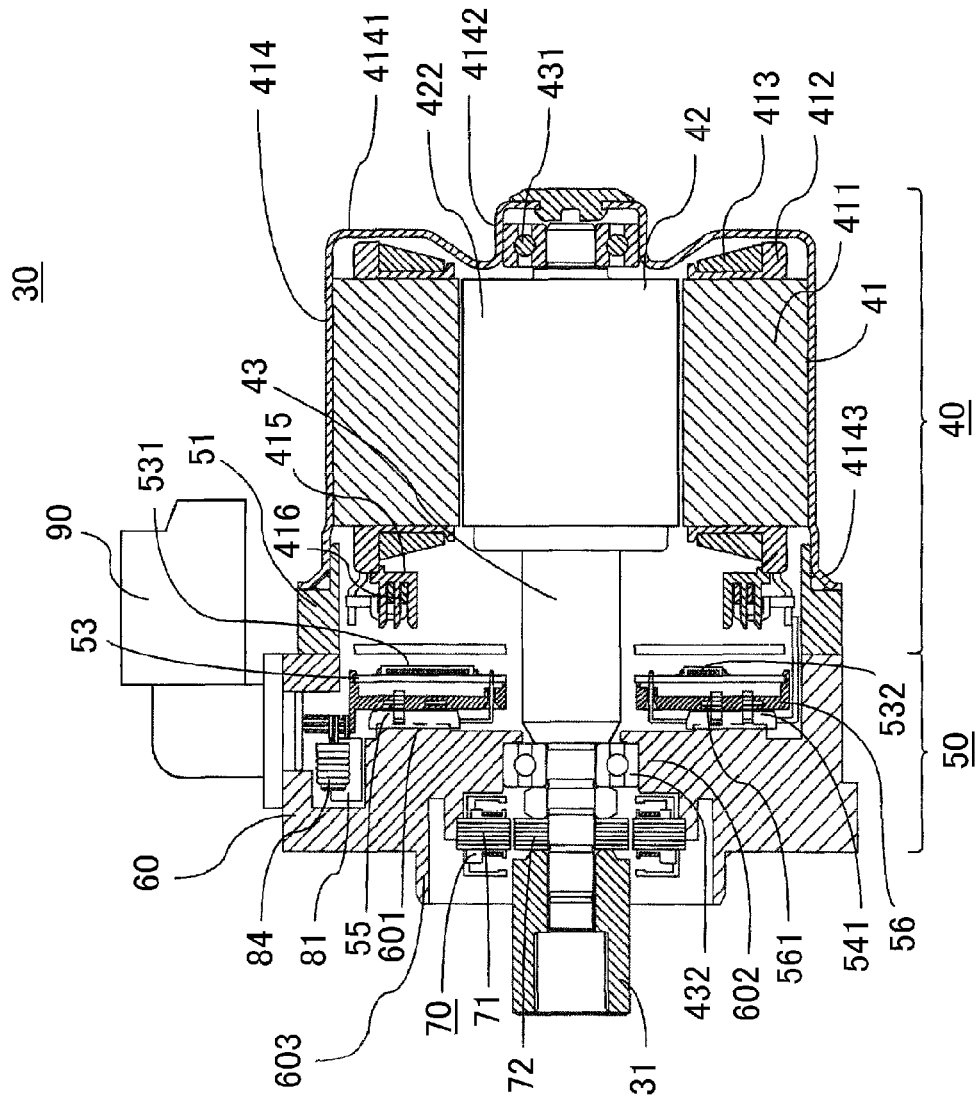
FIG. 2 is a cross-sectional view of a controller-integrated motor in an electric power steering apparatus according to Embodiment 1 of the present invention.

FIG. 1 is a cross-sectional view of an electric power steering apparatus according to Embodiment 1 of the present invention; FIG. 2 is a cross-sectional view of a controller-integrated motor in an electric power steering apparatus according to Embodiment 1 of the present invention. The controller-integrated motor utilized in the electric power steering apparatus according to Embodiment 1 is configured as a permanent-magnet synchronous motor.

In FIGS. 1 and 2, in an electric power steering apparatus 100, a steering shaft 10 coupled with a handwheel (unillustrated) to be operated by a driver is coupled with a controller-integrated motor 30 through the intermediary of a speed reducing mechanism 20. When the handwheel is operated by the driver, the controller-integrated motor 30 exerts assist torque on the steering shaft 10 through the intermediary of the speed reducing mechanism 20 so as to reduce the driver's handwheel operating power.

The speed reducing mechanism 20 includes a worm wheel 21 fixed on the steering shaft 10, a worm gear 22 having a worm gear shaft 23 that engages with the worm wheel 21, and a housing 24. The worm gear shaft 23 is spline-coupled with a rotor shaft 43 of the controller-integrated motor 30 through the intermediary of a boss 31, as a coupling member, that is fixed on the rotor shaft 43 of the controller-integrated motor 30.

The controller-integrated motor 30 is provided with a motor unit 40 including a stator 41, a rotor 42, and a three-phase stator winding (hereinafter, referred to simply as a stator winding) 413, a controller unit 50, as a motor controller, that includes a motor driving circuit, and a speed reducing mechanism case 60, as a metal case. The stator 41 is provided with a hollow cylindrical stator iron core 411 formed of a plurality of laminated electromagnetic steel plates and the stator winding 413 wound around the stator iron core 411 through the intermediary of a resin insulator 412. The stator iron core 411 is fixed pressed into the inner side of a cylindrical iron frame 414.

The frame 414 has a bottom portion 4141 at one end in the axis direction thereof; a rear bearing box 4142 is formed at the middle of the bottom portion 4141. The rear bearing 431 formed of a ball bearing is fixed pressed into the inner circumferential surface of the rear bearing box 4142 of the frame 414.

The other end of the frame 414 in the axis direction thereof is opened; in the peripheral portion of the other, opened end, there is formed a socket portion ("INROH" portion in Japanese) 4143 for coupling the other end with a motor-side case 51. The frame 414, the socket portion 4143 of which is fit into a step portion formed around the outer circumferential surface of one end of the motor-side case 51 in the axis direction thereof, is fixed to the motor-side case 51 by means of screws (unillustrated). The motor-side case 51 is formed of an aluminum-alloy die-casting mold; the other end of the motor-side case 51 is coupled with one end of the speed-reducing-mechanism-side case 60 in the axis direction thereof.

The stator winding 413 is configured with a U-phase winding, a V-phase winding, and a W-phase winding; in Embodiment 1, the stator winding 413 is Y-connected by use of a winding terminal 416 contained in a resin terminal holder 415. In some cases, the stator winding 413 is Δ-connected.

The rotor 42 is provided with the rotor shaft 43 and a rotor magnetic pole 422 formed of a permanent magnet fixed on the outer circumference of the rotor shaft 43. The one end of the rotor shaft 43 is pivotably supported by the rear bearing 431. The rotor magnetic pole 422 rotates in synchronization with the rotation of a rotating magnetic field generated when a three-phase AC current is supplied to the stator winding 413.

The speed reducing mechanism case 60 is formed of an aluminum-alloy die-casting mold and is provided with an inner wall 601 that extends in a direction perpendicular to the axis direction thereof. A front bearing box 602 is formed in the middle of the inner wall 601. A front bearing 432 formed of a ball bearing is fixed pressed into the inner circumferential surface of the front bearing box 602. The speed reducing mechanism case 60 and the housing 24 of the speed reducing mechanism 20 are integrally fixed to each other in such a way that an socket portion 603, of the speed reducing mechanism case 60, that is formed on the one end in the axis direction thereof is fit into the inner circumferential surface of the housing 24 of the speed reducing mechanism 20.

A rotation sensor 70 formed of a resolver is provided in the middle of the inner space of the speed reducing mechanism case 60. The rotation sensor 70 is provided with a stator 71 fixed on the inner circumferential surface of an after-mentioned terminal mold unit 56 fixed inside the speed reducing mechanism case 60 and a rotor 72 fixed on the outer circumferential surface of the rotor shaft 43. A detection winding provided on the stator 71 of the rotation sensor 70 generates a rotation detection signal corresponding to the rotation speed of the rotor 72, i.e., the rotation speed of the rotor 42 of the motor unit 40.

The controller unit 50 is provided with a controller inner space that communicates with the inner space on the motor unit 40; in the controller inner space, there are contained a glass-epoxy-resin control substrate 53 on which a microcomputer 531 and an FET driving circuit 532 are mounted, three power mold modules 541, 542, and 543 (only the power mold module 541 is illustrated in FIG. 2) in each of which two power semiconductor chips formed of power MOSFETs, a relay semiconductor chip, and a shunt resistor are mounted and contained, and a relay mold module 55 in which two relay semiconductor chips are mounted. The details of mounting and containing a semiconductor switching device and the like in the three power mold modules 541, 542, and 543 and the relay mold module 55 will be described later.

In the following explanation, each of the power mold modules 541, 542, and 543 and the relay mold module 55 may collectively and simply be referred to as a mold module.

Figure 3:
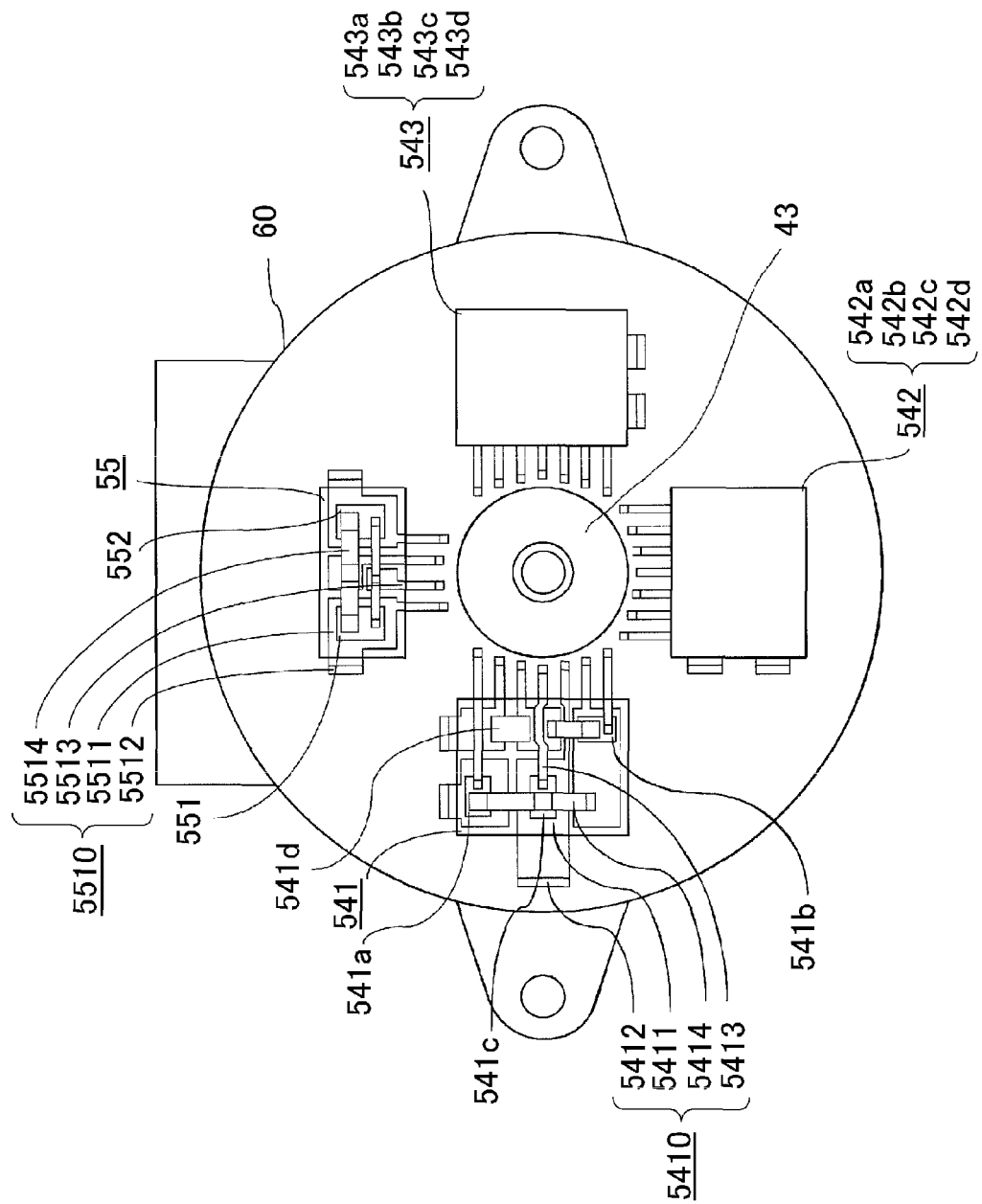
FIG. 3 is a side view illustrating the motor side face of a speed reducing mechanism case in an electric power steering apparatus according to Embodiment 1 of the present invention, when a power mold module and a relay mold module are mounted.

FIG. 3 is a side view illustrating the motor side face of the speed reducing mechanism case in the electric power steering apparatus according to Embodiment 1 of the present invention, when the power mold module and the relay mold module are mounted. The three power mold modules 541, 542, and 543 are provided in such a way as to correspond to the U-phase, V-phase, and W-phase windings, respectively, of the stator winding 413; as illustrated in FIG. 3, the power mold modules 541, 542, and 543 are arranged around the rotor shaft 43 in such a way as to be almost evenly spaced from one another.

The relay mold module 55 is situated between the power mold module 541 and the power mold module 543 and is disposed at the upper part of the drawing. The power mold modules 541, 542, and 543 and the relay mold module 55 are adhered and fixed to the motor-side wall face of the inner wall 601 of the speed reducing mechanism case 60. The power mold modules 541, 542, and 543 and the relay mold module 55 may be adhered and fixed to the wall face, at the speed reducing mechanism side, of the inner wall 601 of the speed reducing mechanism case 60. The foregoing power mold modules and relay mold module are included in the mold modules according to the present invention.

Next, the configurations of the power mold modules 541, 542, and 543 will be explained in detail, taking the power mold module 541 as a representative. The configurations of the power mold modules 542 and 543 are the same as that of the power mold module 541; therefore, the explanation therefor will be omitted.

As illustrated in FIG. 3, in the power mold module 541, power semiconductor chips 541a and 541b forming the U-phase upper arm and the U-phase lower arm, respectively, of a three-phase bridge circuit included in the motor driving circuit, a relay semiconductor chip 541c inserted between the U-phase winding of the stator winding 413 and the U-phase output terminal of the three-phase bridge circuit, and a shunt resistor 541d inserted between the power semiconductor chip 541b and the GND are directly mounted with solder on lead frame die pads 5411 of a copper lead frame 5410, which has a high electric conductivity and a high thermal conductivity.

Each of the power semiconductor chips 541a and 541b, the relay semiconductor chip 541c, and the shunt resistor 541d may collectively and simply be referred to as a device.

The lead frame 5410 includes the lead frame die pad 5411, a lead frame power line lead 5412 that is led out of the mold module 541 for the connection with an external power source, the GND, and a motor power line, a lead frame terminal 5413 that is directly connected with the device so that signals are inputted from and outputted to the outside, and a power terminal 5414 for directly connecting the large-current lines of the devices such as the power semiconductor chips 541b or the relay semiconductor chips 541c in the mold module 541.

A plurality of lead frame terminals 5413 are led out of the mold module and are connected with the glass-epoxy-resin control substrate 53 on which the microcomputer 531 and the FET driving circuit 532 are mounted. The lead frame power line lead 5412 that is led out of the mold module 541 radiates heat; in addition to that, the lead frame power line lead 5412 is directly connected with a power terminal 561 of the after-mentioned terminal mold unit 56 (refer to FIG. 2) so as to perform electrical connection and heat radiation through heat transfer.

Almost the whole opposite side of the mounting side of the lead frame die pad 5411 on which devices are mounted is exposed from the bottom side of the mold resin so as to form a heat radiation side; heat generated in the devices is radiated toward the speed reducing mechanism case 60 that has a heat sink function.

Figure 4:
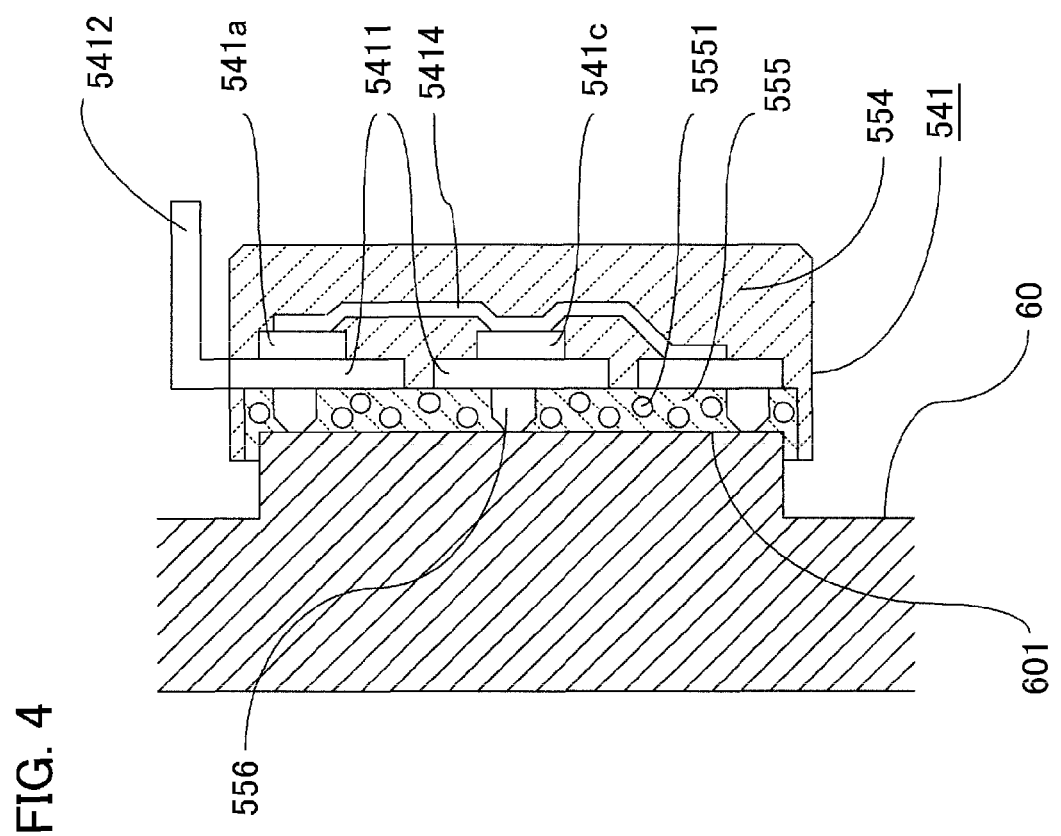
FIG. 4 is a cross-sectional view illustrating the configuration of a mold module utilized in an electric power steering apparatus according to Embodiment 1 of the present invention.

FIG. 4 is a cross-sectional view illustrating the configuration of a mold module utilized in an electric power steering apparatus according to Embodiment 1 of the present invention; FIG. 4 illustrates the power mold module 541. FIG. 4 is a cross-sectional view illustrating the power mold module 541 when the power mold module 541 is mounted on the speed reducing mechanism case 60 that has a heat sink function.

In FIG. 4, almost the whole rear side, which is the opposite side of the device mounting side, of the lead frame die pad 5411 on which the power semiconductor chips 541a and 541b (unillustrated), the relay semiconductor chip 541c, and the shunt resistor 541d (unillustrated) are directly mounted is exposed from a mold resin 554 and forms a heat radiation side; heat generated in the devices is radiated toward the speed reducing mechanism case 60 that has a heat sink function through the intermediary of an adhesive 555, as a heat transfer resin having a high thermal conductivity and a high electric insulation performance, that is filled between the lead frame die pad 5411 and an inner wall 601 of the speed reducing mechanism case 60 that has a heat sink function and 4.

The whole of the power mold module 541 including the power semiconductor chips 541a and 541b, the relay semiconductor chip 541c, the shunt resistor 541d, the lead frame 5410, and the like is molded with a resin molding agent 554, as a mold resin, so as to be integrally fixed; by means of heat transfer through the resin molding agent 554, the thermal balance inside the module is achieved.

In this structure, each of the devices on the lead frame die pads 5411 generates heat corresponding to its power loss; with regard to heat to be radiated from the rear side of the lead frame die pad 5411, the thermal resistance can be reduced in proportion to the area of the lead frame die pad 5411 on which the device is mounted.

The thermal resistance can be reduced in reverse proportion to the thickness of the adhesive 555 filled between the rear side of the lead frame die pad 5411 and the inner wall 601 of the speed reducing mechanism case 60, i.e., the gap between the rear side of the lead frame die pad 5411 and the inner wall 601 of the speed reducing mechanism case 60.

The portion, of the speed reducing mechanism case 60, that is opposite to the rear side of the power mold module 541 is formed to be thicker than the other portions thereof so that the heat capacity thereof is increased; thus, the heat radiation performance is raised.

The film thickness of the adhesive 555, i.e., the gap between the lead frame die pad 5411 and the inner wall 601 of the speed reducing mechanism case 60 is kept constant, because a resin protrusion 556 formed on the side facing the rear side of the power mold module 541, i.e., facing the inner wall 601 of the speed reducing mechanism case 60 abuts against the inner wall 601 of the speed reducing mechanism case 60. As a result, the necessary insulation gap is stably retained, whereby the insulation between the speed reducing mechanism case 60 and the power mold module 541 can be secured. The adhesive 555 having a high thermal conductivity and a high electric insulation performance incorporates filler 5551, which is a heat-conductive particle for raising the thermal conductivity.

Because the source pads of the power semiconductor chip 541a and the relay semiconductor chip 541c are directly connected with each other by use of the power terminal 5414, which is formed of a metal having a high electric conductivity and a high thermal conductivity, heat generation due to an ohmic loss in the connection portion is reduced; in addition to that, by molding the whole module with the resin molding agent 554, the thermal balance inside the module is achieved through the thermal transfer in the resin.

The lead frame die pad 5411 is formed integrally with the lead frame power line lead 5412; the power mold module 541 and the external circuit are directly and electrically connected with each other byway of the lead frame power line lead 5412; thermal radiation toward the outside of the power mold module 541 is implemented through thermal transfer.

Next, the relay mold module 55 illustrated in FIG. 3 will be explained. Two relay semiconductor chips 551 and 552 inserted between the positive-pole DC terminal of the foregoing three-phase bridge circuit and an after-mentioned battery, as a DC power source, are mounted and incorporated in the relay mold module 55.

As illustrated in FIG. 3, in the relay mold module 55, two relay semiconductor chips 551 and 552 are directly mounted with solder on respective lead frame die pads 5511 of a lead frame 5510 formed of a metal having a high electric conductivity and a high thermal conductivity. The lead frame 5510 includes the lead frame die pad 5511, a lead frame power line lead 5512 that is led out of the mold module 55 for the connection with an external power source, the GND, and a motor power line, a lead frame terminal 5513 that is directly connected with the device so that signals are inputted from and outputted to the outside, and a power terminal 5514 for directly connecting the large-current lines of the two relay semiconductor chips 551 and 552 in the relay mold module 55.

A plurality of lead frame terminals 5513 are led out of the relay mold module 55 and are connected with the glass-epoxy-resin control substrate 53 (refer to FIG. 2) on which the microcomputer 531 and the FET driving circuit 532 are mounted. The lead frame power line lead 5512 radiates heat to the outside of the relay mold module 55; in addition to that, the lead frame power line lead 5512 is directly connected with a power terminal 561 of the after-mentioned terminal mold unit 56 so as to perform electrical connection and heat radiation through heat transfer.

Almost the whole rear side, which is the opposite side of the mounting side of the lead frame die pad 5511 on which devices are mounted, is exposed from the mold resin so as to form a heat radiation side; heat generated in the devices is radiated toward the speed reducing mechanism case 60 that has a heat sink function. As is the case with the foregoing power mold module 541, the portion, of the speed reducing mechanism case 60, that is opposite to the rear side of the relay mold module 55 is formed to be thicker than the other portions thereof so that the heat capacity thereof is increased; thus, the heat radiation performance is raised.

As described above, as is the case with the foregoing power mold module 541, the whole of the relay mold module 55 including the relay semiconductor chips 551 and 552, the lead frame 5510, and the like is molded with a resin molding agent 554, as a mold resin, so as to be integrally fixed; by means of heat transfer through the resin molding agent, the thermal balance inside the module is achieved.

Because the configuration and the advantage of the relay mold module 55 are the same as those of the power mold module, explanations for the mounting on the speed reducing mechanism case 60, the inner structure, heat radiation to the speed reducing mechanism case 60 through the intermediary of the adhesive, and the like will be omitted.

Next, in FIG. 2, in the inner space of the speed reducing mechanism case 60, there is provided the terminal mold unit 56 in which a plurality of copper power terminals 561 are inserted into a resin and are integrated. In the terminal mold unit 56, the power mold modules 541, 542, and 543 and the relay mold module 55 are fixed on the speed reducing mechanism case 60 in such a way that they are collectively depressed toward the speed reducing mechanism case 60 so that the positions thereof are fixed.

The control substrate 53 is fixed on the side portion, at the motor side, of the terminal mold unit 56 and is spaced respective given distances away from the power mold modules 541, 542, and 543, the relay mold module 55, and the speed reducing mechanism case 60.

The power terminals 561 are connected with the lead frame power line leads 5412 and 5512 (refer to FIG. 3) that are led out of the power mold modules 541, 542, and 543, so that the power semiconductor chips 541a, 541b, 542a, 542b, 543a, and 543b, the relay semiconductor chips 541c, 542c, and 543c, and the like provided in the power mold modules 541, 542, and 543 are electrically connected with one another.

Three capacitors 81, 82, and 83 (only the capacitor 81 is illustrated in FIG. 2) for absorbing a ripple in the current that flows in the stator winding 413 of the motor unit 40 and a coil 84 for eliminating noise are mounted in the terminal mold unit 56; the capacitors 81, 82, and 83 and the coil 84 are electrically connected with the power terminal 561.

A power source connector 90 fixed on the speed reducing mechanism case 60 is electrically connected with the power terminal 561; the power source connector 90 is connected with the positive-pole DC terminal of the three-phase bridge circuit by way of the semiconductor switching devices 551 and 552 mounted in the relay mold module 55, led out of the speed reducing mechanism case 60, and is connected with a battery, as a DC power source.

Figure 5:
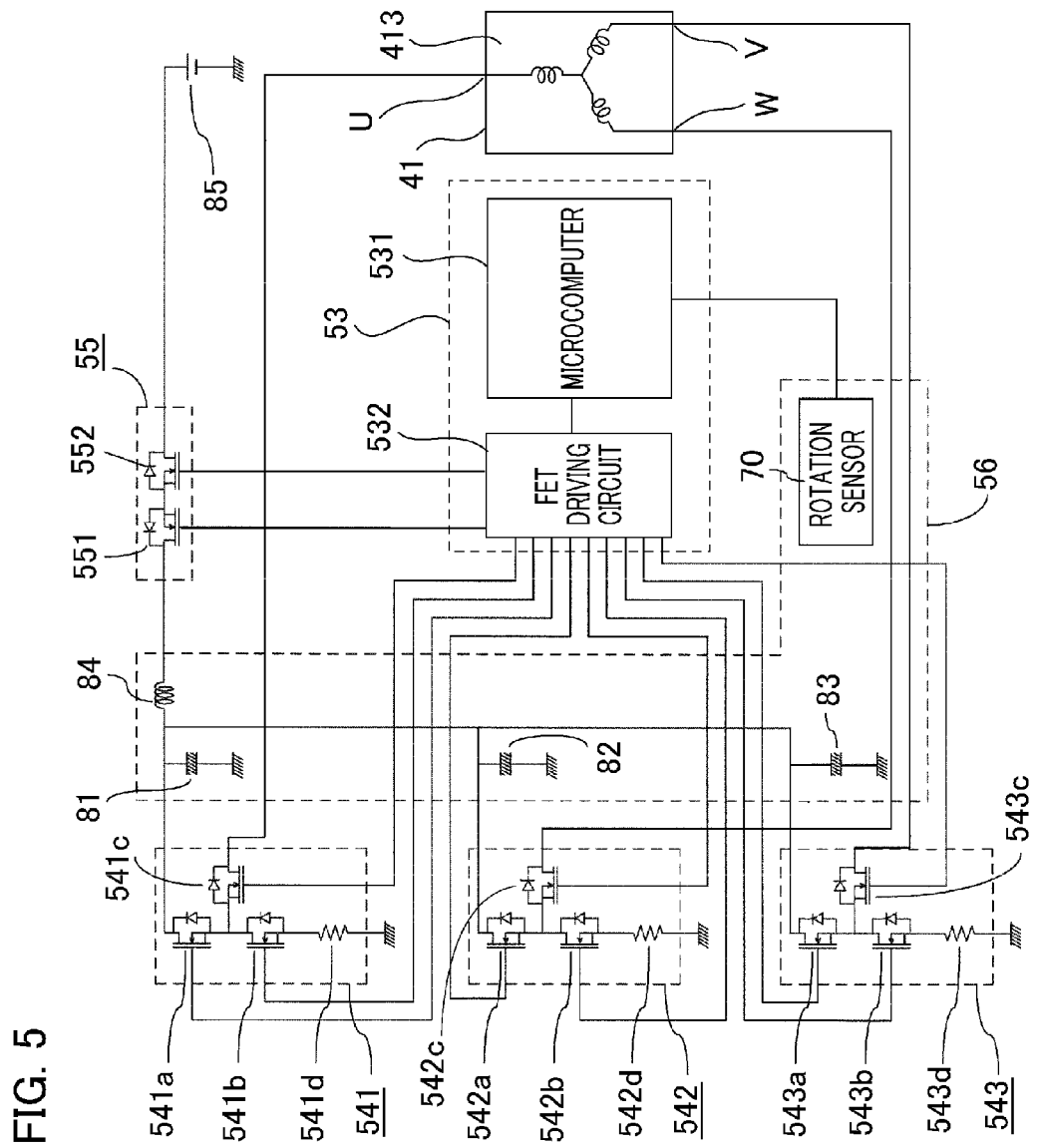
FIG. 5 is a circuit diagram of an electric power steering apparatus according to Embodiment 1 of the present invention.

Next, the circuit configuration of the controller unit 50 configured as described above will be explained. FIG. 5 is a circuit diagram of the electric power steering apparatus according to Embodiment 1 of the present invention. In FIG. 5, as described above, the stator winding 413 is Y-connected by use of the winding terminal 416. The power semiconductor chips 541a and 541b in pairs are mounted and incorporated in the power mold module 541, and respective one ends of them are connected with each other; the power semiconductor chip 541a forms the U-phase upper arm of the three-phase bridge circuit, and the power semiconductor chip 541b forms the U-phase lower arm thereof.

The other end of the power semiconductor chip 541a is connected with the ripple-absorption capacitor 81 and the noise-elimination coil 84; the other end of the power semiconductor chip 541b is connected with the GND by way of the shunt resistor 541d. The connection point at which the respective one ends of the power semiconductor chips 541a and 541b are connected with each other is the U-phase AC terminal of the three-phase bridge circuit. One end of the relay semiconductor chip 541c mounted in the power mold module 541 is connected with the U-phase AC terminal, and the other end thereof is connected with the U-phase terminal of the stator winding 413.

The power semiconductor chips 542a and 542b in pairs are mounted and incorporated in the power mold module 542, and respective one ends of them are connected with each other; the power semiconductor chip 542a forms the W-phase upper arm of the three-phase bridge circuit, and the power semiconductor chip 542b forms the W-phase lower arm thereof.

The other end of the power semiconductor chip 542a is connected with the ripple-absorption capacitor 82 and the noise-elimination coil 84; the other end of the power semiconductor chip 542b is connected with the GND by way of the shunt resistor 542d. The connection point at which the respective one ends of the power semiconductor chips 542a and 542b are connected with each other is the W-phase AC terminal of the three-phase bridge circuit. One end of the relay semiconductor chip 542c mounted in the power mold module 542 is connected with the W-phase AC terminal, and the other end thereof is connected with the W-phase terminal of the stator winding 413.

The power semiconductor chips 543a and 543b in pairs are mounted and incorporated in the power mold module 543, and respective one ends of them are connected with each other; the power semiconductor chip 543a forms the V-phase upper arm of the three-phase bridge circuit, and the power semiconductor chip 543b forms the V-phase lower arm thereof.

The other end of the power semiconductor chip 543a is connected with the ripple-absorption capacitor 83 and the noise-elimination coil 84; the other end of the power semiconductor chip 543b is connected with the GND by way of the shunt resistor 543d. The connection point at which the respective one ends of the power semiconductor chips 543a and 543b are connected with each other is the W-phase AC terminal of the three-phase bridge circuit. One end of the relay semiconductor chip 543c mounted in the power mold module 543 is connected with the V-phase AC terminal, and the other end thereof is connected with the V-phase terminal of the stator winding 413.

Respective one ends of the relay semiconductor chips 551 and 552 in pairs mounted in the relay mold module 55 are connected with each other; the other end of the relay semiconductor chip 551 is connected with the positive-pole DC terminal of the three-phase bridge circuit by way of the coil 84, and the other end of the relay semiconductor chip 552 is connected with a battery 85 mounted in a vehicle through the intermediary of the connector 90 (refer to FIGS. 1 and 2).

The output terminals of the FET driving circuit 532 mounted on the control substrate 53 are connected with the respective gates of the power semiconductor chips 541*a*, 541*b*, 542*a*, 542*b*, 543*a*, and 543*b*, the relay semiconductor chips 541*c*, 542*c*, 543*c*, 551, and 552; the FET driving circuit 532 feeds gate drive signals to those gates at respective predetermined timings. The microcomputer 531 mounted on the control substrate 53 controls the output timings of the gate drive signals that are outputted by the FET driving circuit 532 based on the rotation detection signal from the rotation sensor 70.

In the electric power steering apparatus 100, configured as described above, according to Embodiment 1 of the present invention, when the driver operates the handwheel so as to exert steering torque on the steering shaft 10, an unillustrated torque detection device detects the steering torque and inputs it to the microcomputer 531. The rotation detection signal corresponding to a steering rotation speed detected by the rotation sensor 70 is inputted to the microcomputer 531. The microcomputer 531 calculates assist torque, based on the inputted steering torque, steering rotation speed, vehicle speed signal, and the like, and controls the three-phase bridge circuit, which is a motor drive circuit, so that the motor unit 40 produces torque for exerting the assist torque on the steering shaft 10 through the intermediary of the speed reducing mechanism 20.

In other words, the FET driving circuit 532 generates the gate drive signals at the predetermined timings, based on the command from the microcomputer 531, so as to control conduction of the power semiconductor chips 541*a*, 541*b*, 542*a*, 542*b*, 543*a*, and 543*b* of the three-phase bridge circuit. As a result, the three-phase bridge circuit generates predetermined three-phase AC electric power and supplies a three-phase AC current to the stator winding 413 of the motor unit 40 so as to drive the motor unit 40. Torque, as assist torque, produced by the motor unit 40 is exerted on the steering shaft 10 through the intermediary of the speed reducing mechanism 20. Accordingly, handwheel operation power by the driver is reduced.

In this situation, when an ON-state failure occurs in any one of the power semiconductor chips 541*a*, 541*b*, 542*a*, 542*b*, 543*a*, and 543*b* or when ON-state failures occur in two or more power devices, the normal three-phase AC current is not supplied to the stator winding 413 and hence the operation of the motor unit 40 becomes abnormal, thereby bringing about a risk in driving the vehicle.

Accordingly, when an abnormality occurs in the foregoing power device, the FET driving circuit 532 stops the gate drive signals for the relay semiconductor chips 551 and 552 inserted between the positive-pole DC terminal of the three-phase bridge circuit and the battery 85, based on the command from the microcomputer 531, and stops the gate drive signals for the relay semiconductor chips 541*c*, 542*c*, and 543*c* connected between the AC output terminals of the three-phase bridge circuit and the windings for the respective phases of the stator winding 413.

As a result, the three-phase bridge circuit, as a motor drive circuit, provided in the controller unit 50 is disconnected from the battery 85 and stops its operation; at the same time, the stator winding 413 is disconnected from the three-phase bridge circuit. Because the stator winding 413 is disconnected from the three-phase bridge circuit, the failed power semiconductor chip does not short-circuit the stator winding 413; therefore, an abnormal condition, for example, that braking force having a direction opposite to the steering direction is produced in the motor unit 40 and hence handwheel operation becomes difficult can be prevented.

It may be allowed that when a device or the like other than the power semiconductor chip fails, the gate drive signals for the relay semiconductor chips 551 and 552 and the relay semiconductor chips 541*c*, 542*c*, and 543*c* are stopped, as described above. Moreover, it may be allowed that depending on the condition of a failure in the power semiconductor chip or on the condition of a failure of the device or the like other than the power semiconductor chip, the gate drive signal only for any one of the relay semiconductor chips 551 and 552 and the relay semiconductor chips 541*c*, 542*c*, and 543*c* is stopped.

In the foregoing explanation, both the switches connected between the battery 85 and the positive-pole DC terminal of the three-phase bridge circuit and the switches connected between the AC output terminals of the three-phase bridge circuit and the stator winding 413 are formed of relay semiconductor chips; however, it may be allowed that among those switches, one group of the switches are formed of relay semiconductor chips and the other group of switches are formed of mechanical relays.

As described above, in the mold module and the electric power steering apparatus according to Embodiment 1 of the present invention, the semiconductor chip, which is a heating element, is configured with the relay mold module 55 and the power mold modules 541, 542, and 543 that are molded with resin; in the mold module, the lead frame power line leads 5412 and 5512, which are signal lines, are directly connected with the semiconductor chips; the semiconductor chips are directly mounted on the surfaces of the lead frame die pads 5411 and 5511; the rear sides of the lead frame die pads 5411 and 5511 form heat radiation sides in such a way that almost the whole of them are exposed, and heat is radiated through the adhesive 555 to the speed reducing mechanism case 60 having a heat sink function; the lead frame power line leads 5412 and 5512 are connected with and held by the terminal mold unit 56; and inner semiconductor chips are connected with one another by use of the power terminals 5414 and 5514. As a result, heat generation is reduced, the thermal distribution in the mold module is equalized, and the performance of heat radiation to the heat sink can be raised; in addition, heat transfer from the lead frame power line leads 5412 and 5512 can also raise the heat radiation performance.

In the mold module and the electric power steering apparatus according to Embodiment 1 of the present invention, there is provided the protrusion 556 formed of a resin for the purpose of setting the gap of an adhesive layer formed of the adhesive 555 filled between the mold module and the speed reducing mechanism case 60 that has a heat sink function; therefore, the thermal resistance between the adhesive layers can be stabilized only by depressing the mold module from the top thereof so as to stably keep the gap between the adhesive layers constant.

In the electric power steering apparatus according to Embodiment 1 of the present invention; the portion, at the rear side of the mole module, of the speed reducing mechanism case 60 having a heat sink function is formed thick; therefore, the heat capacity is increased so that the heat radiation performance can be raised.

In the electric power steering apparatus according to Embodiment 1 of the present invention; the power mold module in which the semiconductor switches and the power devices are mounted is divided into three portions corresponding to the three phases, and then the three portions are mounted on the case; therefore, because the respective power mold modules for the three phases can freely be arranged and hence the space can effectively be utilized, the apparatus can be downsized. Moreover, because the three power mold modules are radially arranged around the rotor shaft of the motor unit, the projected area viewed along the rotor shaft can be reduced.

Embodiment 2

Figure 6:
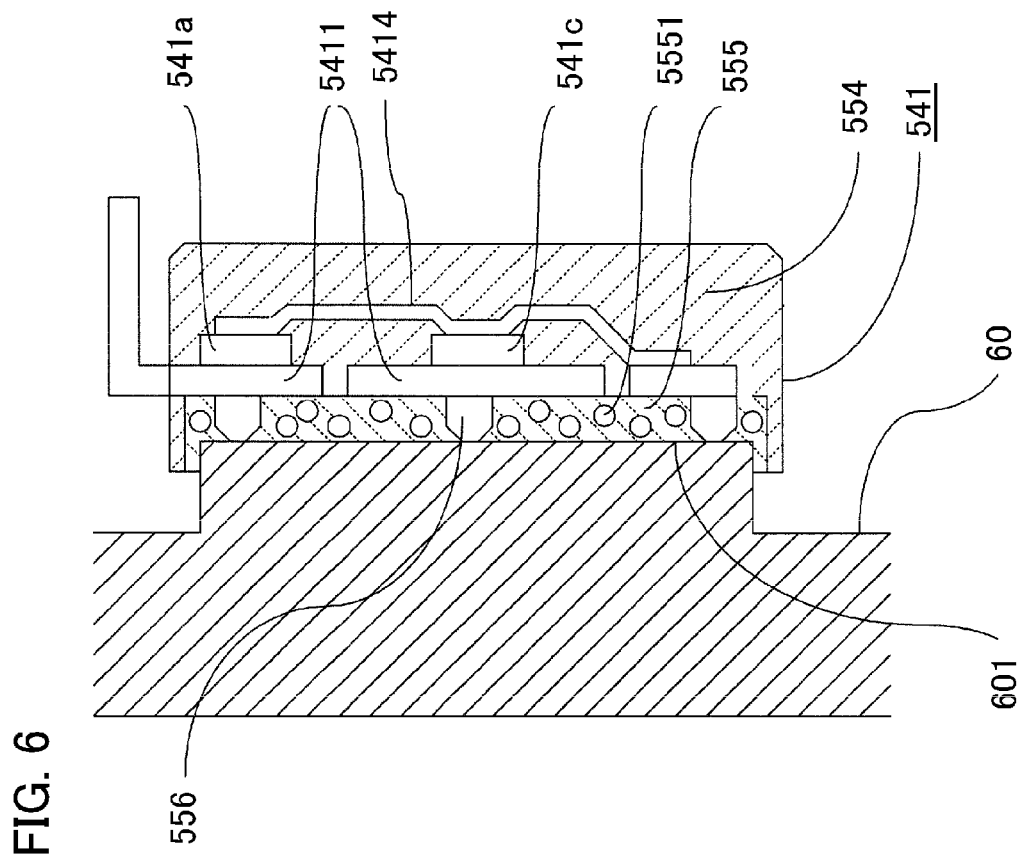
FIG. 6 is a cross-sectional view illustrating the configuration of a mold module utilized in an electric power steering apparatus according to Embodiment 2 of the present invention.

FIG. 6 is a cross-sectional view illustrating the configuration of a mold module utilized in an electric power steering apparatus according to Embodiment 2 of the present invention. As explained in Embodiment 1, due to the respective power losses caused by driving the electric power steering apparatus, the power semiconductor chips 541a, 542a, 543a, 541b, 542b, and 543b and the relay semiconductor chips 541c, 542c, and 543c generate heat; however, by changing the ratios of the areas of the lead frame die pads in accordance with the respective power losses, the temperatures of the devices can be averaged.

Accordingly, in Embodiment 2, as illustrated in FIG. 6, in order to make the temperature of the relay semiconductor chip 541c an average one,—the loss ratio of the relay semiconductor chip 541c is larger than that of the power semiconductor chip 541a—, the area ratio of the lead frame die pad 5411 on which the relay semiconductor chip 541c is mounted is made larger than that of the lead frame die pad 5411 on which the power semiconductor chip 541a is mounted.

As described above, even when due to the change in driving conditions for the semiconductor chips and the electric power steering apparatus, the loss ratios of the semiconductor chips change, the thermal equation can be achieved by changing the area ratios of the lead frame die pads.

As described above, in the mold module utilized in the electric power steering apparatus according to Embodiment 2, the area ratios of the lead frame die pads are set in accordance with the loss ratios of the semiconductor chips, so that the temperatures of the devices can be equalized and hence heat radiation can effectively be performed.

Embodiment 3

Figure 7:
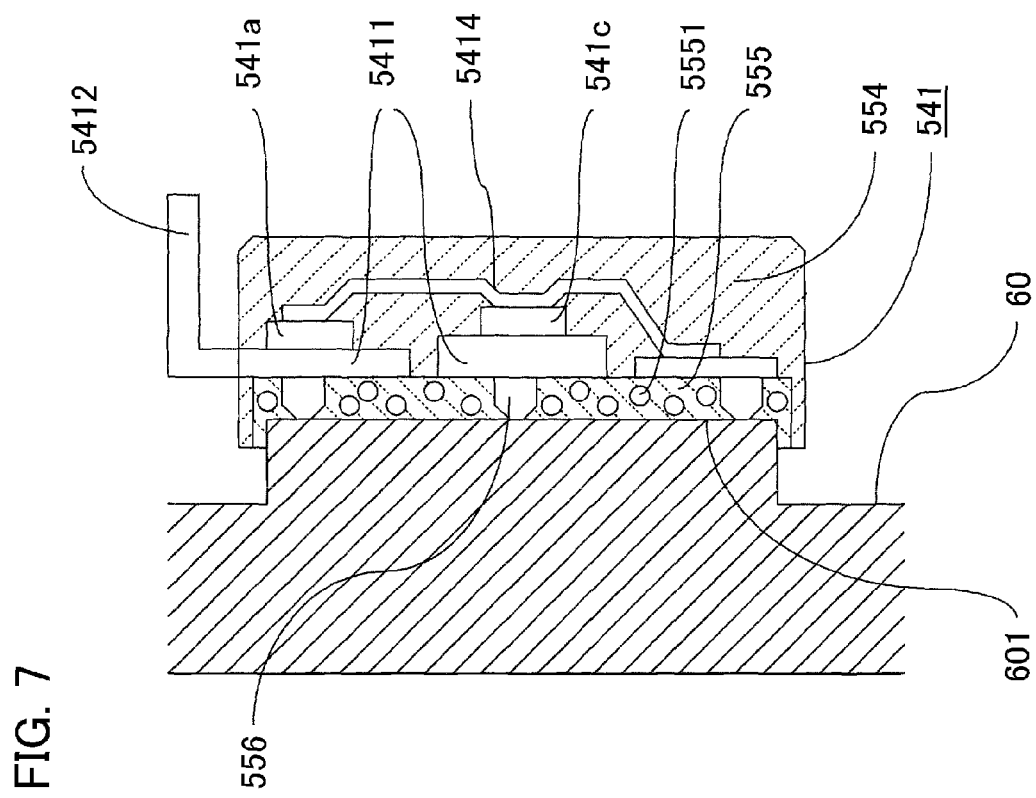
FIG. 7 is a cross-sectional view illustrating the configuration of a mold module utilized in an electric power steering apparatus according to Embodiment 3 of the present invention.

FIG. 7 is a cross-sectional view illustrating the configuration of a mold module utilized in an electric power steering apparatus according to Embodiment 3 of the present invention. The power semiconductor chips 541a, 542a, 543a, 541b, 542b, and 543b and the relay semiconductor chips 541c, 542c, and 543c are mounted on the lead frame die pads 5411 and 5511; the thicknesses of the lead frame die pads 5411 and 5511 are enlarged, so that the heat capacities thereof are increased and the heat transfer can be improved. In FIG. 7, there is increased the thickness of only the lead frame die pad 5411 on which the relay semiconductor chip 541c, the loss of which is large in comparison with those of mounted semiconductor chips, is mounted.

In the mold module utilized in the electric power steering apparatus according to Embodiment 3 of the present invention, the thicknesses of the lead frame die pads on which incorporated devices are mounted are set in accordance with the losses of the devices; therefore, the temperatures of the devices are equalized and hence heat radiation can effectively be performed.

Embodiment 4

Figure 8:
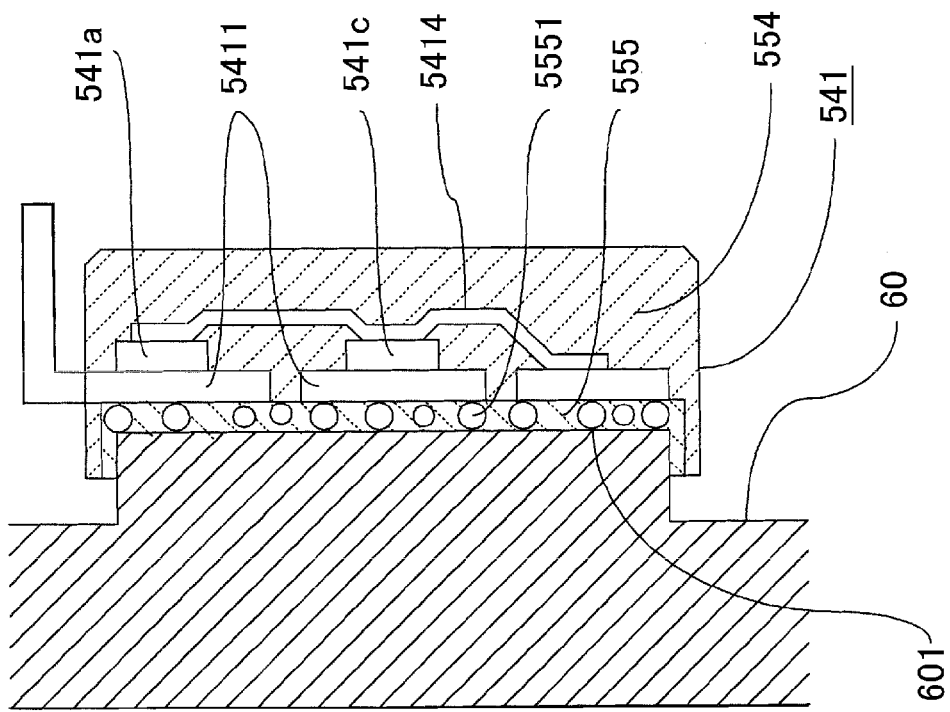
FIG. 8 is a cross-sectional view illustrating the configuration of a mold module utilized in an electric power steering apparatus according to Embodiment 4 of the present invention.

FIG. 8 is a cross-sectional view illustrating the configuration of a mold module utilized in an electric power steering apparatus according to Embodiment 4 of the present invention. In Embodiments 1 through 3, the gap of the adhesive layer formed of the adhesive 555 filled between the mold module 541 and the speed reducing mechanism case 60 having a heat sink function is set by means of the protrusion 556; however, in Embodiment 4, instead of the protrusion 556, the gap is set by use of the filler 5551, which are thermal-conductive particles included in the adhesive 555. In Embodiment 4, while the protrusion 556 is not required, the thermal resistance can be stabilized only by depressing the mold module from the top thereof so as to stably keep the gap between the adhesive layers constant.

Embodiment 5

Figure 9:
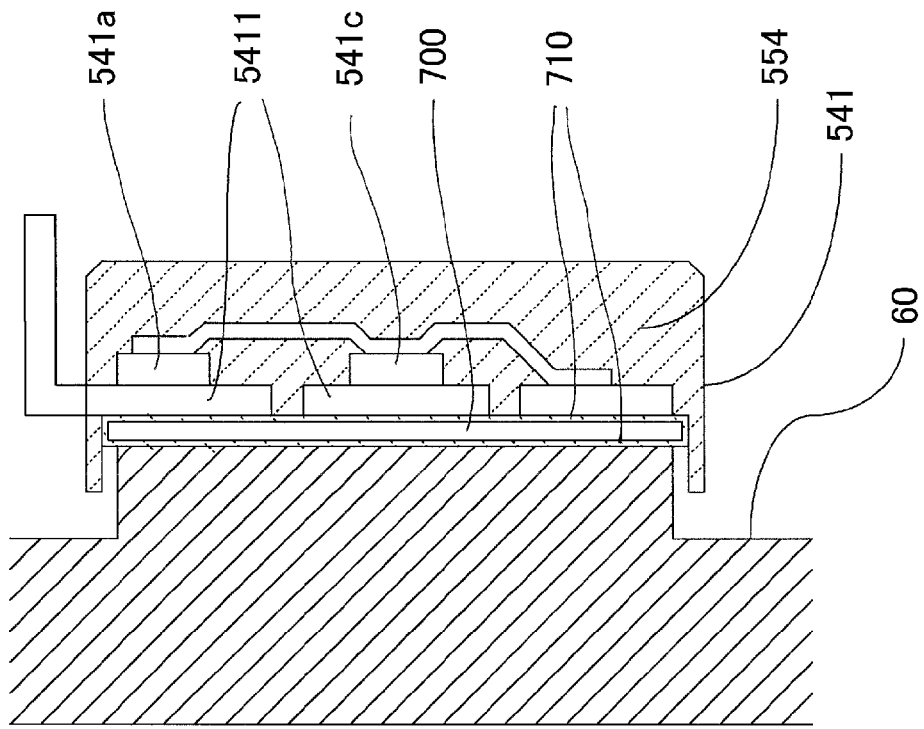
FIG. 9 is a cross-sectional view illustrating the configuration of a mold module utilized in an electric power steering apparatus according to Embodiment 5 of the present invention.

FIG. 9 is a cross-sectional view illustrating the configuration of a mold module utilized in an electric power steering apparatus according to Embodiment 5 of the present invention. In foregoing Embodiments 1 through 4, the adhesive 555 is filled between the mold module 541 and the speed reducing mechanism case 60; however, in Embodiment 5, instead of the adhesive, a high-thermal-conductivity and high-strength ceramic insulation sheet 700 is inserted between the mold module 541 and the speed reducing mechanism case 60. As a result, while the high thermal conductivity is kept, the gap is stabilized through the thickness of the ceramic insulation sheet 700; in addition, even in the case where electrically-conductive foreign materials intrude, the bottom side of the mold module 541 or the speed reducing mechanism case 60 is distorted, or burrs occur, the insulation between the mold module 541 and the speed reducing mechanism case 60 can be secured; thus, the reliability of insulation can be enhanced. The space between the ceramic insulation sheet 700 and the mold module 541 and the space between the ceramic insulation sheet 700 and the speed reducing mechanism case 60 are coated with heat-radiation silicon grease, so that the heat conductivity can further be raised.

Embodiment 6

Figure 10:
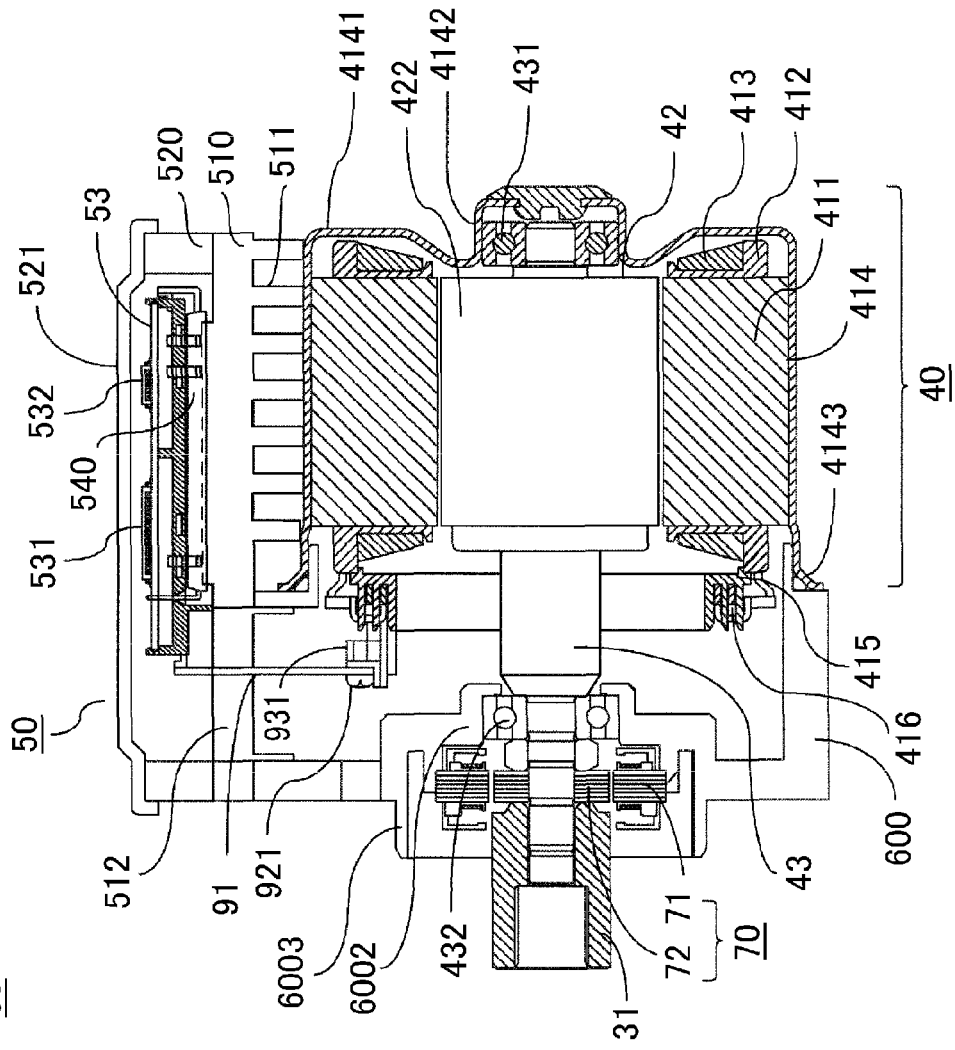
FIG. 10 is a cross-sectional view of a controller-integrated motor in an electric power steering apparatus according to Embodiment 6 of the present invention.

FIG. 10 is a cross-sectional view of a controller-integrated motor in an electric power steering apparatus according to Embodiment 6 of the present invention. In Embodiment 5, the controller-integrated motor is configured as a permanent-magnet synchronous motor.

In FIG. 10, a speed reducing mechanism case 600 fixed to the housing (refer to FIG. 1) of the speed reducing mechanism is formed of aluminum-alloy die-casting mold. An socket portion 6003 formed at one end of the speed reducing mechanism case 600 is fit into and fixed with a bolt or the like to an unillustrated housing of the speed reducing mechanism. A front bearing box 6002 is formed in the speed reducing mechanism case 600. A front bearing 432 formed of a ball bearing is fixed pressed into the inner circumferential surface of the front bearing box 6002.

The rotation sensor 70 formed of a resolver is provided with the stator 71 fixed on the speed reducing mechanism case 60 (refer to FIG. 1) and the rotor 72 fixed on the outer circumferential surface of the rotor shaft 43. A power mold module 540 of the controller unit 50 is disposed in the frame member 520 and is fixed adhered to the inner wall 601 (refer to FIG. 1) of the speed reducing mechanism case 60. With regard to the frame 414 of the motor unit 40, the socket portion thereof formed at the open end in the axis direction thereof is fit into the motor-side end of the speed reducing mechanism 600 and is fixed to the speed reducing mechanism case 600 by means of screws (unillustrated).

The controller case 520, as a metal case, is provided with a heat sink 510 having fins 511 and a cover 521. The controller case 520 is disposed and fixed at the upper portion of the speed reducing mechanism case 600. The heat sink 510, which is the bottom of the controller case 520, is formed of an aluminum alloy and is fixed with screws to the bottom portion of the side wall of the controller case 520.

In one side of the heat sink 510, there is formed a heat sink opening portion 512 whose shape is the same as the shape of the opening portion, of the speed reducing mechanism, formed at the upper portion of the speed reducing mechanism case 600, and whose center axis line coincides with the center axis line of the opening portion of the speed reducing mechanism. The speed reducing mechanism case opening portion and the heat sink opening portion are arranged to overlap with each other in such a way that the respective center axis centers thereof coincide with each other.

A single mold module abuts against and is fixed to the surface of the heat sink 510. As illustrated in FIG. 5, in the mold module 540, there are mounted the power semiconductor chip 541a forming the U-phase upper arm of the three-phase bridge circuit that is included in the motor drive circuit, the power semiconductor chip 541b forming the U-phase lower arm, the power semiconductor chip 542a forming the W-phase upper arm, the power semiconductor chip 542b forming the W-phase lower arm, the power semiconductor chip 543a forming the V-phase upper arm, and the power semiconductor chip 543b forming the V-phase lower arm.

In addition, in the mold module 540, there are mounted and incorporated the relay semiconductor chip 541c inserted between the U-phase winding of the stator winding and the U-phase output terminal of the three-phase bridge circuit, the relay semiconductor chip 542c inserted between the W-phase winding of the stator winding and the W-phase output terminal of the three-phase bridge circuit, the relay semiconductor chip 543c inserted between the V-phase winding of the stator winding and the V-phase output terminal of the three-phase bridge circuit, the shunt resistor 541d inserted between the power semiconductor chip 541b and the GND, the shunt resistor 542d inserted between the power semiconductor chip 542b and the GND, and the shunt resistor 543d inserted between the power semiconductor chip 543b and the GND.

In FIG. 10, there is not illustrated a relay mold module, as a motor drive circuit, that includes two relay semiconductor chips inserted between the positive-pole DC terminal of the three-phase bridge circuit and the external battery; however, the relay mold module may be integrated with the relay mold module 540; alternatively, the relay mold module, as another module, may be fixed to the heat sink 510 abutting against it, as is the case with the power mold module 540; alternatively, the relay mold module may be fixed to the inner surface of the wall portion of the speed reducing mechanism case 600, abutting against it.

The control substrate 53 on which the microcomputer 531 and the FET driving circuit 532 are mounted is fixed in the controller case 520 and at the upper end of the controller case 520, through the intermediary of a gap between the power mold module 540 and the controller substrate 53.

Three bus bars 91, 92, and 93 (only the bus bar 91 is illustrated in FIG. 10) connected with the U-phase terminal, V-phase terminal, and the W-phase terminal, respectively, of the stator winding 413 of the motor unit 40 are led out of the heat sink opening portion 512 to the controller case 520 through the speed reducing mechanism opening portion, and are connected with the respective relay semiconductor chips that are connected with the AC terminals of the three-phase bridge circuit.

The bus bar 91 (92, 93) is fixed with a screw 921 to a base 931 fixed to a terminal holder 415. The detection winding provided on the stator of the rotation sensor 70 formed of a resolver is connected with a controller-side connector (unillustrated) provided on the controller case 520, by way of a signal connection connector 941 (unillustrated). The controller-side connector is connected with the microcomputer 531 mounted on the control substrate 53. The other configurations are the same as those in Embodiment 1.

In the electric power steering apparatus, according to Embodiment 5, that is configured as described above, all the U-phase, V-phase, and W-phase power semiconductor chips and all the relay semiconductor chips for cutting off the conduction in the motor stator windings are mounted in the power mold module 540 or a group of the power mold modules and a group of the relay mold modules are separately mounted in the power mold module 540; therefore, because in comparison with the power steering apparatus according to Embodiment 1, it is only necessary to a single or two power mold modules are mounted in the electric power steering apparatus, and wiring among the power devices can be performed in the one or two power mold module, the workability for the electric power steering apparatus is raised and hence an advantage of reducing the cost is demonstrated.

Moreover, the controller case 520 on which the power mold module is mounted is provided outside the speed reducing mechanism case 600; therefore, because a component of the motor unit 40 and a component of the controller unit 50 are not mingled with each other, it is made possible to perform designing dedicated to each function.

The heat sink fins 511 may be provided on the outer wall of the speed reducing mechanism case 600 protruding from the housing 24 of the speed reducing mechanism, or the wall portion of the metal case may be formed in such a way that the thickness thereof is increased. As a result, heat radiation from the power mold module fixed to and abutting against the metal case can be effectively implemented.

Embodiment 7

Figure 11:
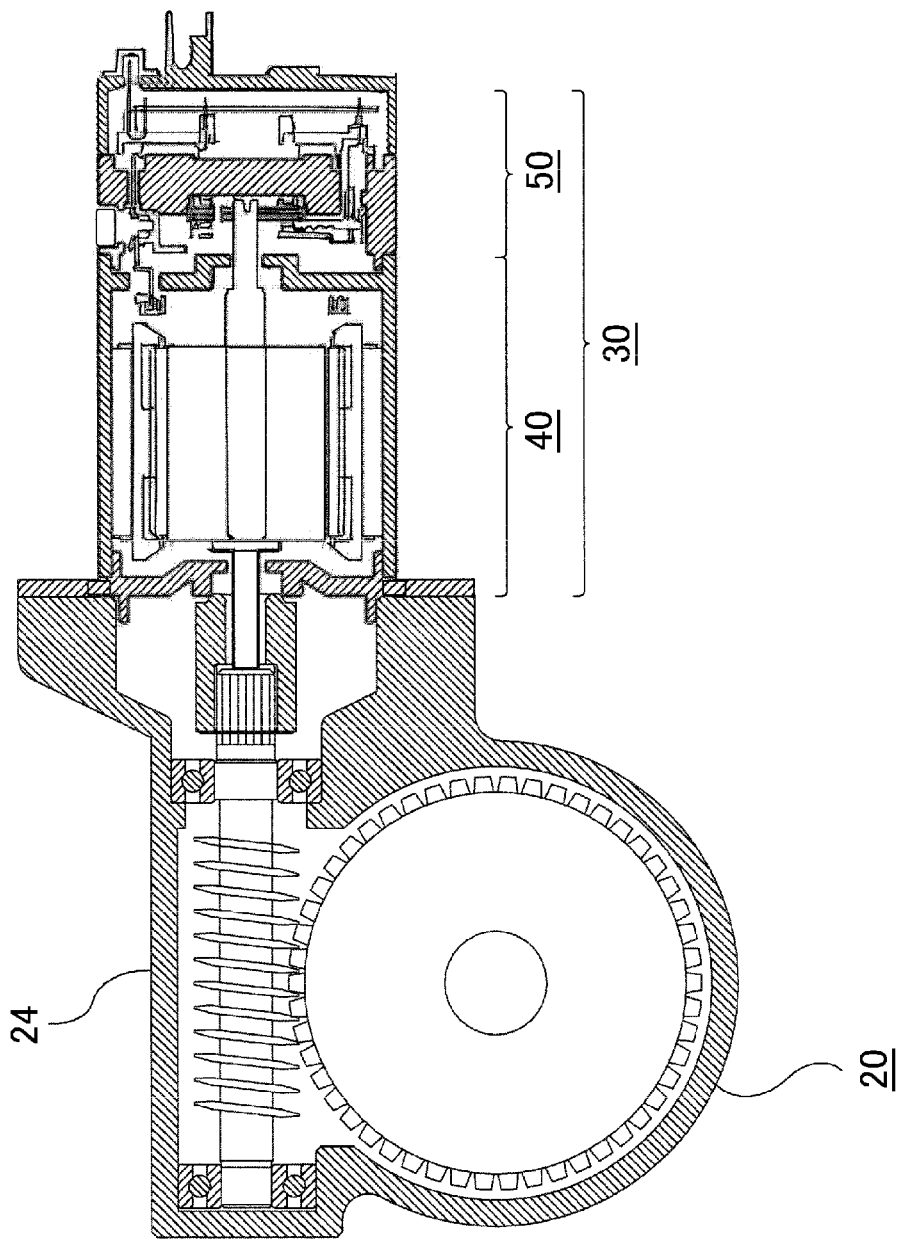
FIG. 11 is a cross-sectional view of an electric power steering apparatus according to Embodiment 7 of the present invention.

FIG. 11 is a cross-sectional view of an electric power steering apparatus according to Embodiment 7 of the present invention. In Embodiment 1, the arrangement configuration of the controller-integrated motor 30 is made in such a way that one end of the controller unit 50 including the motor drive circuit abuts against the speed reducing mechanism 20 and the motor unit 40 abuts against the other end of the controller unit 50; however, in the arrangement configuration of the controller-integrated motor 30 according to Embodiment 6, one end of the motor unit 40 abuts against the speed reducing mechanism 20 and the controller unit 50 abuts against the other end of the motor unit 40.

With the foregoing configuration, the motor unit 40 provides a heat capacity to heat generation in the controller unit 50, and also provides a heat radiation path and a heat conductive path, thereby radiating heat to the speed reducing mechanism 20; thus, there is demonstrated an advantage that the controller unit 50 including heat-generating semiconductor chips is cooled.

The mold modules according to the present invention, described heretofore, are characterized as follows:

(1) In a mold module according to the present invention, a plurality of terminals for forming wiring leads and a plurality of electronic components mounted on the respective terminals are molded with a molding resin; the mold module is characterized in that at least part of the plurality of terminals are exposed at the rear side of the molding resin. The mold module configured as described above makes it possible to reduce the thermal resistances of electronic components such as semiconductor chip and the like in a steady-state manner as well as in a transient manner and to raise the heat radiation effect.

(2) A mold module according to the present invention is characterized in that the respective surface areas of the plurality of terminals are set in accordance with the thermal loss in the electronic component mounted on the terminal. In the mold module configured as described above, the area ratio of a radiation side, which is the bottom side of a lead frame die pad, is changed in accordance with the power loss ratio of the electronic component to be included; therefore, there is demonstrated an advantage that the temperatures of the inside of the mold module and the electronic components are equalized, that the heat radiation effect of the mold module is raised, and that the total area is optimized and minimized.

(3) A mold module according to the present invention is characterized in that the respective thicknesses of the plurality of terminals are set in accordance with the thermal loss in the electronic component mounted on the terminal. In the mold module configured as described above, the thickness of a lead frame is changed in accordance with the total loss of incorporated electronic components or the power loss ratio of the electronic component; therefore, there is demonstrated an advantage that the temperatures of the inside of the mold module and the electronic components are equalized, that the heat radiation effect of the mold module is raised, and that the total area and the total volume are optimized and minimized.

(4) A mold module according to the present invention is characterized in that the plurality of terminals are formed of wiring leads for connecting the plurality of electronic component. In the mold module configured as described above, internal semiconductor chips are connected with the power line not by means of wire bonding but by use of copper terminals, and the terminals can traverse inside the mold module; therefore, there is demonstrated that heat generation is reduced and the temperatures of the inside of the mold module, the chips, and the terminals are equalized.

Electric power steering apparatuses according to the present invention are characterized as follows:

(5) An electric power steering apparatus according to the present invention is provided with a speed reducing mechanism coupled with the steering shaft of a vehicle, a motor whose rotor shaft is coupled with the speed reducing mechanism, and a motor controller that controls electric power supplied to the armature winding of the motor so as to make the motor produce predetermined torque. The electric power steering apparatus is characterized in that the motor controller is provided with a mold module in which a plurality of terminals for forming wiring leads and a plurality of electronic components mounted on the respective terminals are molded with a molding resin and in which at least part of the plurality of terminals are exposed at the rear side of the mold resin, and in that the rear side of the mold module is adhered to the motor case through the intermediary of the resin. The electric power steering apparatus configured as described above makes it possible to reduce the thermal resistances of electronic components such as semiconductor chip and the like in a steady-state manner as well as in a transient manner and to raise the heat radiation effect.

(6) An electric power steering apparatus according to the present invention is characterized in that the motor case to which the mold module is adhered is a speed-reducing-mechanism-side case fixed to the speed reducing mechanism. It is made possible to reduce the thermal resistances of electronic components such as semiconductor chip and the like in a steady-state manner as well as in a transient manner and to raise the heat radiation effect.

(7) An electric power steering apparatus according to the present invention is characterized in that the motor case to which the mold module is adhered is a case situated opposed to the speed reducing mechanism. The electric power steering apparatus configured as described above makes it possible to reduce the thermal resistances of electronic components such as semiconductor chip and the like in a steady-state manner as well as in a transient manner and to raise the heat radiation effect.

(8) An electric power steering apparatus according to the present invention is characterized in that the mold module is provided with a protrusion protruding from the rear side and in that the heat transfer resin is filled into a gap formed by the protrusion between the motor case and the rear side of the mold module. The electric power steering apparatus configured as described above demonstrates an advantage that the distance of the gap between the bottom side of the lead frame and the motor case, into which the heat transfer resin is filled, can readily and securely be set and kept only by depressing the mold module from the top side thereof.

(9) An electric power steering apparatus according to the present invention is characterized in that there is provided filler included in the heat transfer resin and in that the gap between the motor case and the rear side of the mold module is secured by means of the filler. Because the distance of the gap is kept constant by means of the filler included in the heat transfer resin, the electric power steering apparatus configured as described above demonstrates an advantage that without adding any extra production facility or any extra mechanism structure, the distance of the gap can readily and securely be set and kept only by depressing the mold module from the top side thereof.

(10) An electric power steering apparatus according to the present invention is provided with a speed reducing mechanism coupled with the steering shaft of a vehicle, a motor whose rotor shaft is coupled with the speed reducing mechanism, and a motor controller that controls electric power supplied to the armature winding of the motor so as to make the motor produce predetermined torque. The electric power steering apparatus is characterized in that the motor controller is provided with a mold module in which a plurality of terminals for forming wiring leads and a plurality of electronic components mounted on the respective terminals are molded with a molding resin and in which at least part of the plurality of terminals are exposed at the rear side of the mold resin, and in that the mold module is adhered to the motor case through the intermediary of the insulation sheet whose rear side is formed of a ceramic material. The electric power steering apparatus configured as described above makes it possible that, while the high thermal conductivity is kept, the gap is stabilized through the thickness of the ceramic insulation sheet and that even in the case where electrically-conductive foreign materials intrude, the bottom side of the mold module or the motor case is distorted, or burrs occur, the insulation between the mold module and the motor case can be secured; thus, the reliability of insulation can be enhanced. The space between the ceramic insulation sheet and the mold module and the space between the ceramic insulation sheet and the motor case are coated with heat-radiation silicon grease, so that the heat conductivity can further be raised.

(11) An electric power steering apparatus according to the present invention is provided with a speed reducing mechanism coupled with the steering shaft of a vehicle, a motor whose rotor shaft is coupled with the speed reducing mechanism, and a motor controller that controls electric power supplied to the armature winding of the motor so as to make the motor produce predetermined torque. The electric power steering apparatus is characterized in that the motor controller is provided with a mold module in which a plurality of terminals for forming wiring leads and a plurality of electronic components mounted on the respective terminals are molded with a molding resin and in which at least part of the plurality of terminals are exposed at the rear side of the mold resin, a heat sink for cooling the mold module, and a controller case that incorporates the mold module and the heat sink, and in that the rear side of the mold module is adhered to the heat sink through the intermediary of a heat transfer resin. The electric power steering apparatus configured as described above makes it possible to reduce the thermal resistances of electronic components such as semiconductor chip and the like in a steady-state manner as well as in a transient manner and to raise the heat radiation effect.

(12) An electric power steering apparatus according to the present invention is characterized in that the controller case is adhered to a speed-reducing-mechanism-side case of the motor. In the electric power steering apparatus configured as described above, because the motor case having a large thermal capacity provides a heat conductive path and hence heat is transferred toward the gear on which the electric power steering apparatus is mounted, the effect of cooling the power circuit can be enhanced.

(13) An electric power steering apparatus according to the present invention is characterized in that the heat sink has a heat sink opening portion formed at a position corresponding to a speed-reducing-mechanism-side case opening portion formed in the speed-reducing-mechanism case and in that a bus bar connected with the armature winding of the motor extends from the inside of the speed-reducing-mechanism-side case of the motor to the inside of the controller case by way of the speed-reducing-mechanism-side case opening portion and the heat sink opening portion and then is connected with the mold module in the controller case. The electric power steering apparatus configured as described above makes it possible to integrally fix the motor and the motor controller in a compact manner and to effectively perform wiring work.

(14) An electric power steering apparatus according to the present invention is characterized in that the mold module is provided with a protrusion protruding from the rear side and in that the heat transfer resin is filled into a gap formed by the protrusion between the heat sink and the rear side of the mold module. The electric power steering apparatus configured as described above demonstrates an advantage that the distance of the gap between the bottom side of the lead frame and the heat sink, into which the heat transfer resin is filled, can readily and securely be set and kept only by depressing the mold module from the top side thereof.

(15) An electric power steering apparatus according to the present invention is characterized in that there is provided filler included in the heat transfer resin and in that the gap between the heat sink and the rear side of the mold module is secured by means of the filler. Because the distance of the gap is kept constant by means of the filler included in the heat transfer resin, there is demonstrated an advantage that without adding any extra production facility or any extra mechanism structure, the distance of the gap can readily and securely be set and kept only by depressing the mold module from the top side thereof.

(16) An electric power steering apparatus according to the present invention is provided with a speed reducing mechanism coupled with the steering shaft of a vehicle, a motor whose rotor shaft is coupled with the speed reducing mechanism, and a motor controller that controls electric power supplied to the armature winding of the motor so as to make the motor produce predetermined torque. The electric power steering apparatus is characterized in that the motor controller is provided with a mold module in which a plurality of terminals for forming wiring leads and a plurality of electronic components mounted on the respective terminals are molded with a molding resin and in which at least part of the plurality of terminals are exposed at the rear side of the mold resin, a heat sink, and a controller case that incorporates the mold module and the heat sink, and in that the rear side of the mold module is adhered to the heat sink through the intermediary of a ceramic insulation sheet. The electric power steering apparatus configured as described above makes it possible that, while the high thermal conductivity is kept, the gap is stabilized through the thickness of the ceramic insulation sheet and that even in the case where electrically-conductive foreign materials intrude, the bottom side of the mold module or the case of the heat sink is distorted, or burrs occur, the insulation between the mold module and the heat sink can be secured; thus, the reliability of insulation can be enhanced. The space between the ceramic insulation sheet and the mold module and the space between the ceramic insulation sheet and the heat sink are coated with heat-radiation silicon grease, so that the heat conductivity can further be raised.

(17) An electric power steering apparatus according to the present invention is characterized in that the mold module includes power semiconductor chips of an electric-power conversion circuit that converts DC electric power from a DC power source into AC electric power and supplies the AC electric power to the armature winding. Because the electric power steering apparatus configured as described above can incorporate upper and lower arms for at least one phase in an inverter circuit included in the electric-power conversion circuit, there is demonstrated an advantage that the temperatures of the upper and lower arms are equalized.

(18) An electric power steering apparatus according to the present invention is characterized in that the mold module incorporates a relay semiconductor chip that can disconnect the motor from the power source. The electric power steering apparatus configured as described above demonstrates an advantage that there can be realized an electronic relay for an electric power steering apparatus in which the temperature equalization and the heat radiation performance are raised.

(19) An electric power steering apparatus according to the present invention is characterized in that the motor is a controller-integrated motor in which the motor controller is mounted and in that the motor controller is disposed along a direction in which the center axis of the rotor shaft of the motor extends. In the electric power steering apparatus configured as described above, the motor and the motor controller including a power circuit are integrated with each other so as to be thermally coupled with each other; therefore, the motor case having a large thermal capacity provides a heat conductive path whereby heat can effectively be radiated. Moreover, because the motor controller is mounted at the side of the speed reducing mechanism, there is demonstrated an advantage that heat is transferred to the speed reducing mechanism and hence the power circuit and the like can effectively be cooled.

(20) An electric power steering apparatus according to the present invention is characterized in that the motor is a controller-integrated motor in which the motor controller is mounted and in that the motor controller is disposed at a position that is in parallel with the center axis of the rotor shaft of the motor. In such a manner as describe above, an electric power steering apparatus provided with a compact controller-integrated motor can be obtained.

INDUSTRIAL APPLICABILITY

A mold module and an electric power steering apparatus according to the present invention are utilized in the field of steering apparatuses in the automobile industry.

DESCRIPTION OF REFERENCE NUMERALS

10: steering shaft
100: electric power steering apparatus
20: speed reducing mechanism 21: worm wheel
22: worm gear
23: worm gear shaft
24: housing
30: controller-integrated motor
31: boss
40: motor unit
41: stator
411: stator iron core
412: insulator
413: stator winding
414: frame
4141: bottom portion
4142: rear bearing box
4143: socket portion
415: terminal holder
416: winding terminal
42: rotor
422: rotor magnetic pole
43: rotor shaft
431: rear bearing
432: front bearing
50: controller unit
51: motor-side case
510: heat sink
511: heat sink fin
512: heat sink opening portion
520: controller case
521: cover
53: control substrate
531: microcomputer
531: FET driving circuit
541, 541, 542, 543: power mold module
5410, 5510: lead frame
541a, 541b, 542a, 542b, 543a, 543b: power semiconductor chip
541c, 542c, 543c: relay semiconductor chip
541d, 542d, 543d: shunt resistor
5411, 5511: lead frame die pad
5412, 5512: lead frame power line lead
5413, 5513: lead frame terminal
5414, 5514: power terminal
55: relay mold module
554: resin molding agent
555: adhesive
5551: filler
556: protrusion
700: ceramic insulation sheet
710: silicon grease
56: terminal mold unit
561: power terminal
60: speed-reducing-mechanism-side case
600: speed-reducing-mechanism-side case
601: inner wall of speed-reducing-mechanism-side case
602: front bearing box
6002: front bearing box
603, 6003: socket portion
70: rotation sensor
71: stator
72: rotor
81, 82, 83: capacitor
84: coil
85: battery
90: power source connector
901: fixed portion
91: bus bar
921: screw
931: base

The invention claimed is:

1. A mold module utilized as a power unit of an electric power steering apparatus, formed by molding with a molding resin a plurality of lead frames for forming wiring leads and a plurality of electronic components mounted on the respective lead frames, wherein at least part of the plurality of lead frames are exposed at the rear side of the molding resin, and
   wherein the respective thicknesses of the plurality of lead frames are set in accordance with the thermal loss in the electronic component mounted on the lead frame such that the thickness of one lead frame of the plurality of lead frames is different than the thickness of at least one other lead frame of the plurality of lead frames.

2. The mold module utilized as a power unit of an electric power steering apparatus, according to claim 1, wherein the respective surface areas of the plurality of lead frames are set in accordance with the thermal loss in the electronic component mounted on the lead frame.

3. The mold module utilized as a power unit of an electric power steering apparatus, according to claim 1, wherein the plurality of lead frames are formed of wiring leads for connecting the plurality of electronic components.

4. An electric power steering apparatus comprising:
   a speed reducing mechanism coupled with a steering shaft of a vehicle,
   a motor whose rotor shaft is coupled with the speed reducing mechanism, and
   a motor controller that controls electric power supplied to an armature winding of the motor so as to make the motor produce predetermined torque,
   wherein the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, and
   wherein the rear side of the mold module is adhered to the case of the motor through the intermediary of a heat transfer resin, and
   wherein the mold module is provided with a protrusion that protrudes from the rear side, and the heat transfer resin is filled into a gap formed by the protrusion between the motor case and the rear side of the mold module.

5. The electric power steering apparatus according to claim 4, wherein the motor case to which the mold module is adhered is a speed-reducing-mechanism-side case fixed to the speed reducing mechanism.

6. The electric power steering apparatus according to claim 4, wherein the motor case to which the mold module is adhered is a case situated opposed to the speed reducing mechanism.

7. An electric power steering apparatus comprising:
   a speed reducing mechanism coupled with a steering shaft of a vehicle,
   a motor whose rotor shaft is coupled with the speed reducing mechanism, and
   a motor controller that controls electric power supplied to an armature winding of the motor so as to make the motor produce predetermined torque,
   wherein the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, and the rear side of the mold module is adhered to the motor case through the intermediary of a heat transfer resin including a filler, and wherein the gap between the motor case and the rear side of the mold module is secured by the filler.

8. An electric power steering apparatus comprising:

a speed reducing mechanism coupled with a steering shaft of a vehicle, a motor whose rotor shaft is coupled with the speed reducing mechanism, and wherein the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, a heat sink, and a controller case that incorporates the mold module and the heat sink, wherein the rear side of the mold module is adhered to the heat sink through the intermediary of a heat transfer resin, wherein the heat sink has a heat sink opening portion formed at a position corresponding to a speed-reducing-mechanism-side case opening portion formed in the speed-reducing-mechanism case, and wherein a bus bar connected with the armature winding of the motor extends from the inside of the speed-reducing-mechanism-side case of the motor to the inside of the controller case by way of the speed-reducing-mechanism-side case opening portion and the heat sink opening portion and then is connected with the mold module in the controller case.

9. The electric power steering apparatus according to claim 8, wherein the controller case is fixed to the speed-reducing-mechanism-side case of the motor.

10. The electric power steering apparatus according to claim 8, wherein the mold module is provided with a protrusion that protrudes from the rear side, and the heat transfer resin is filled into a gap formed by the protrusion between the heat sink and the rear side of the mold module.

11. The electric power steering apparatus according to claim 8, further including filler included in the heat transfer resin, wherein the gap between the heat sink and the rear side of the mold module is secured by the filler.

12. An electric power steering apparatus comprising:

a speed reducing mechanism coupled with a steering shaft of a vehicle, a motor whose rotor shaft is coupled with the speed reducing mechanism, and wherein the motor controller is provided with a mold module in which a plurality of lead frames for forming wiring leads and a plurality of electronic components mounted on the respective lead frames are molded with a molding resin and in which at least part of the plurality of lead frames are exposed at the rear side of the mold resin, a heat sink, and a controller case that incorporates the mold module and the heat sink, wherein the rear side of the mold module is adhered to the heat sink through the intermediary of a ceramic insulation sheet, and wherein the controller case is fixed to the speed-reducing-mechanism-side case of the motor.

13. The electric power steering apparatus according to claim 4, wherein the mold module includes power semiconductor chips of an electric-power conversion circuit that converts DC electric power from a DC power source into AC electric power and supplies the AC electric power to the armature winding.

14. The electric power steering apparatus according to claim 4, wherein the mold module includes a relay semiconductor chip that can disconnect the motor from a power source.

15. The electric power steering apparatus according to claim 4, wherein the motor is a controller-integrated motor in which the motor controller is mounted, and the motor controller is disposed along a direction in which the center axis of the rotor shaft of the motor extends.

16. The electric power steering apparatus according to claim 4, wherein the motor is a controller-integrated motor in which the motor controller is mounted, and the motor controller is disposed at a position that is in parallel with the center axis of the rotor shaft of the motor.

17. A mold module utilized as a power unit of an electric power steering apparatus, formed by molding with a molding resin a plurality of lead frames for forming wiring leads and a plurality of electronic components mounted on the respective front sides of the lead frames, wherein at least part of the rear side, of each of the plurality of lead frames, that corresponds to one of the plurality of mounted electronic components is exposed at the rear side of the molding resin and the peripheral portion of the exposed part of each of the plurality of lead frames is covered with the molding resin, wherein a power terminal unit electrically connects a first electronic component of the plurality of electronic components with a first lead frame of the plurality of lead frames, and wherein a lead frame power line lead extended from the first lead frame, at least part of the rear side of which is exposed, is bent towards the front side of the first lead frame.

* * * * *